United States Patent
Wieduwilt et al.

(10) Patent No.: US 11,120,860 B1
(45) Date of Patent: Sep. 14, 2021

(54) STAGGERING REFRESH ADDRESS COUNTERS OF A NUMBER OF MEMORY DEVICES, AND RELATED METHODS, DEVICES, AND SYSTEMS

(71) Applicant: Micron Technology, Inc., Boise, ID (US)

(72) Inventors: Christopher G. Wieduwilt, Boise, ID (US); James S. Rehmeyer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/987,168

(22) Filed: Aug. 6, 2020

(51) Int. Cl.
  *G11C 11/40* (2006.01)
  *G11C 11/406* (2006.01)

(52) U.S. Cl.
  CPC .................. *G11C 11/406* (2013.01)

(58) Field of Classification Search
  CPC .................................................. G11C 11/406
  See application file for complete search history.

(56) References Cited

U.S. PATENT DOCUMENTS

| | | | | |
|---|---|---|---|---|
| 4,238,842 | A * | 12/1980 | Aichelmann, Jr. | ... G11C 11/406 365/222 |
| 8,347,171 | B2 * | 1/2013 | Seo | ...... G06F 11/1048 714/754 |
| 8,547,767 | B2 * | 10/2013 | Ruckerbauer | ..... G11C 11/40611 365/222 |
| 9,318,185 | B2 * | 4/2016 | Kim | .................. G11C 11/40618 |
| 9,418,723 | B2 * | 8/2016 | Chishti | ............. G11C 11/40611 |
| 9,576,637 | B1 * | 2/2017 | Balakrishnan | ........ G06F 3/0611 |
| 10,157,657 | B2 * | 12/2018 | Zheng | .................... G11C 11/406 |

OTHER PUBLICATIONS

Wieduwilt et al., U.S. Appl. No. 16/833,045 titled Staggered Refresh Counters for a Memory Device, filed Mar. 27, 2020.

\* cited by examiner

*Primary Examiner* — Vanthu T Nguyen
(74) *Attorney, Agent, or Firm* — TraskBritt

(57) ABSTRACT

Methods of operating a number of memory devices are disclosed. A method may include adjusting a count of a refresh address counter of at least one memory device of a number of memory devices such that the count of the refresh address counter of the at least one memory device is offset from a count of a refresh address counter of at least one other memory device of the number of memory devices. The method may also include receiving, at each of the number of memory devices, a refresh command. Further, the method may include refreshing, at each of the number of memory devices, a row of memory cells indicated by the count of an associated refresh address counter. Related systems and memory modules are also described.

20 Claims, 10 Drawing Sheets

STAGGERING REFRESH ADDRESS COUNTERS OF A NUMBER OF MEMORY DEVICES, AND RELATED METHODS, DEVICES, AND SYSTEMS

TECHNICAL FIELD

Embodiments of the disclosure relate to memory devices. More specifically, various embodiments relate to staggering refresh address counters of a number of memory devices, and to related methods, devices, and systems.

BACKGROUND

Memory devices are widely used to store information in various electronic devices such as computers, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile. Non-volatile memory (e.g., FeRAM) may maintain their stored logic value for extended periods of time even in the absence of an external power source. Volatile memory devices (e.g., DRAM) may lose their stored state when disconnected from an external power source.

DETAILED DESCRIPTION

Figure 1:
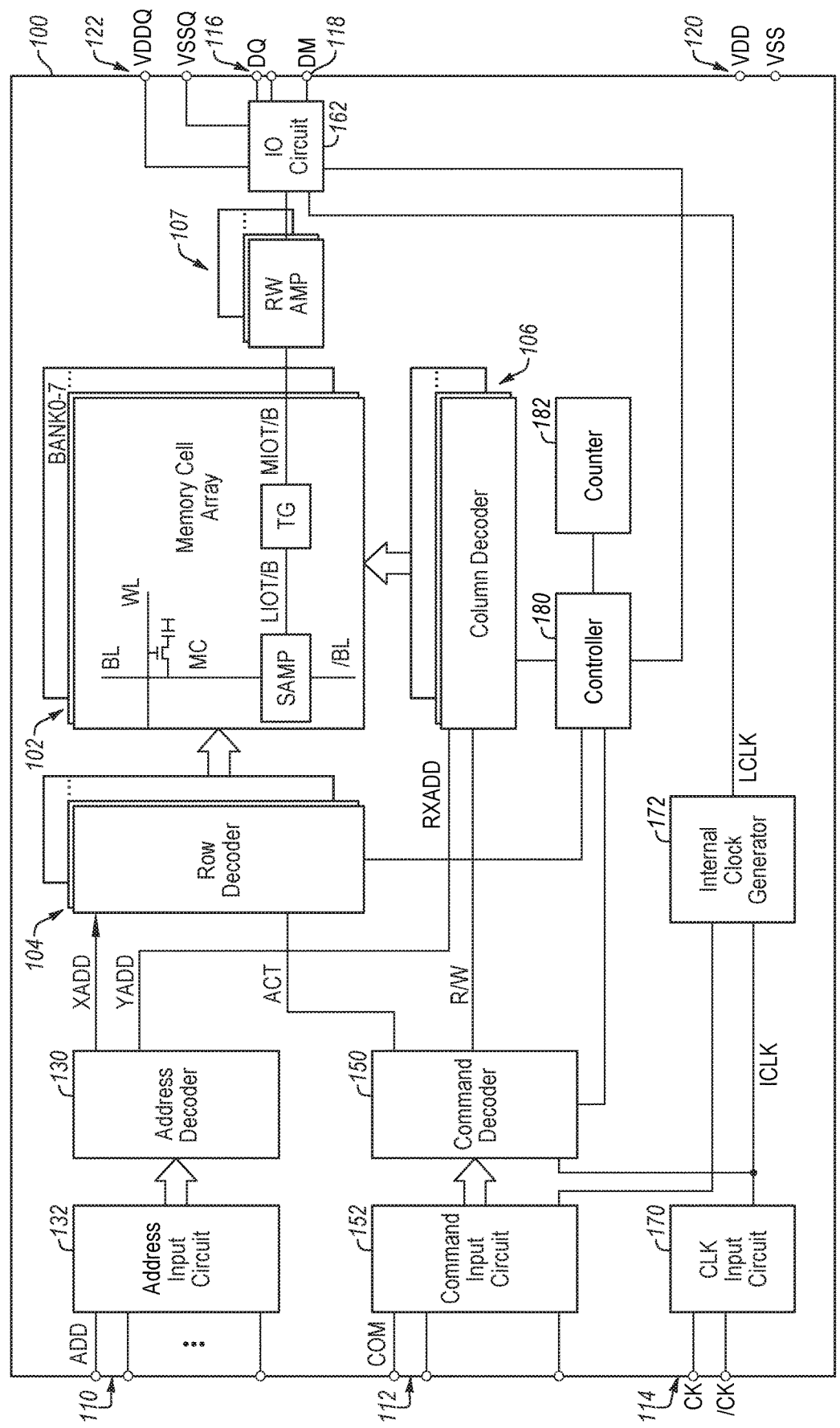
FIG. 1 is a block diagram of an example memory device, according to various embodiments of the present disclosure.

For some types of memory cells (e.g., volatile memory cells), refresh operations may be used to maintain logic values stored by the memory cells. For example, the memory cells may lose their stored logic values over time (e.g., due to leakage or other effects), and a refresh operation may include reading stored logic values from a set of memory cells and writing those same logic values back to the set of memory cells.

In some cases, multiple memory devices (e.g., memory devices in a rank of a dual in-line memory module (DIMM)) may each include at least one respective memory array and may share a command/address (CA) bus. Because the CA bus is shared, refresh commands over the CA bus may also be shared (e.g., each of the memory devices may receive the same refresh command at the same time).

As described herein, a memory device may include or otherwise be associated with (e.g., be coupled with) a counter (also referred to herein as an "refresh address counter," a "address counter," or a "refresh counter"), and when the memory device is to perform a refresh operation, the memory device may activate one or more word lines based on a value (e.g., binary number) (also referred to herein as an "index") indicated by the refresh address counter. For example, the value of the refresh address counter of a memory device may comprise or otherwise indicate a row address of the memory device, and when the memory device performs a refresh operation, the memory device may refresh one or more rows (e.g., multiple rows) of memory cells, wherein the row corresponds to the value of the refresh address counter. After a refresh operation, the value of the refresh address counter may be incremented. In conventional memory systems, a refresh address counter of each memory device of a device or system (e.g., a memory module) includes the same count value. In other words, upon boot or reboot, a refresh address counter of each memory device of a memory module is initialized to the same binary value. Thus, in response to a refresh command received at each of the memory devices, the same row of memory cells of each memory device of the memory module is refreshed.

As memory density has increased, intermittent failure has appeared in some memory devices, which may experience failures due to repeated access to a particular row of memory cells (e.g., cells coupled to an access line). For example, rows physically adjacent a row being frequently accessed have an increased probability of experiencing data corruption. The repeated access of a particular row can be referred to as a "hammering" event, and the hammering of a row may cause issues such as migration across a passgate and/or through bulk silicon, for example. Leakage and parasitic currents caused by the hammering of a row may cause data corruption in a non-accessed physically adjacent row, which may be referred to as a neighbor row or victim row.

The row hammer effect is due to the nature of a memory cell, which can include one transistor and one capacitor. The charge state of a capacitor may determine whether a memory cell stores a "1" or "0" as a binary value. In addition, a large number of memory cells are packed tightly together. The closely packed cells may cause an activated wordline and/or an activated capacitor to have an effect on a charge of an adjacent capacitor, especially when one of the cells is rapidly activated (e.g., a row hammer effect). In addition, the capacitors can have a natural discharge rate and may be rewritten in order to compensate for this discharge, referred to as "refreshing."

Some approaches to reduce the adverse effects of row hammering include refreshing adjacent rows responsive to a determination that a hammering event has occurred. For example, responsive to determining that a particular row has been the target of repeated accesses (e.g., the row has undergone more than a threshold number of accesses within a refresh period), its physically adjacent neighbor rows may be selected for a targeted refresh operation, which may be referred to as a row hammer refresh (RHR) operation.

In addition to performing RHR operations, increasing a refresh rate of a memory device may reduce an amount of hammers a row of the memory device is subject to. In other words, increasing a refresh rate may reduce a time duration in which a victim row is hammered. Nonetheless, row hammer attacks are still concerning, especially in a worst case scenario. As will be appreciated, because each device of a DIMM (or a rank of a DIMM) shares commands, a number of memory devices (e.g., 18 for a DDR4 RDIMM) of the DIMM may experience the same row hammer attack. In one scenario (e.g. a worst case scenario) wherein a row hammer refresh circuit does not detect an attack on a victim row, it may take a full refresh cycle (e.g., 32 ms) before the victim rows are refreshed via normal auto refresh commands.

According to various embodiments, a refresh address counter of at least one memory device of a number of memory devices (e.g., of a rank and/or a DIMM) may be programmed with and/or may include a unique start address. In other words, to prevent a set of memory devices from all refreshing the same rows at the same time, even if they share the same CA bus or otherwise perform concurrent refresh operations, the refresh address counters for at least some of the memory devices may be staggered (offset relative to each other) such that at any given time, at least some of the memory devices have refresh address counters with different values. Thus, when a refresh command is received, even if one or more memory devices of a device (e.g., a DIMM) have refresh address counters with values indicating a first row, one or more other memory devices of the device may have refresh address counters with different values indicating other rows.

More specifically, according to some embodiments, a refresh address counter of each memory device of a number of memory devices (e.g., of a rank and/or a DIMM) may be programmed with and/or may include a unique start address. Staggering a counter (e.g., a refresh address counter) for each memory device (i.e., of a number of memory devices) may ensure that, during a worst case scenario, only one memory device of the number of memory devices experiences a worst case row hammer attack. In other words, shifting a refresh address counter value at each memory device (i.e., differently) may minimize how many memory devices of the number of memory devices are subject to a worst case scenario. Stated yet another way, configuring each refresh address counter (e.g., of a number of memory devices of a rank and/or a DIMM) slightly out of phase with one another may result in each memory device having a different hammer address to refresh address differential, thus having a different hammer time period from hammer to auto refresh of the victim address(es).

According to some embodiments, each of a number of DIMMS (e.g., of a memory system) may receive and/or be programmed with a unique shift solution (e.g., in the manufacturing flow). More specifically, according to some embodiments, to introduce the staggering between refresh address counters, fuse circuitry associated with each memory device may be programmed such that the refresh address counters for at least some of the memory devices are set to indicate different (e.g., offset, staggered) values. For example, such staggering may be introduced upon a boot or reboot of the memory devices. In some cases, the refresh address counters at the memory devices may be incremented in like fashion (e.g., according to the same pattern or progression) as refreshes are received and refresh operations are performed at the different memory devices, thus, offsets between refresh address counters of the memory devices may be maintained during operation of the memory devices.

For example, an address count of a number of memory devices (e.g., of a memory module) may be shifted based on a refresh rate and/or a number of devices (e.g., of a rank and/or DIMM) that share the same refresh command. In at least some embodiments, a stagger time may be divided up equally across all devices in a rank. A full chip refresh rate and number of devices per rank/DIMM sharing commands may be factors in determining the time to divide up equally across all devices on a DIMM. For example, if a full chip refresh time was 32 ms and a DIMM had 8 devices, a 4 ms stagger may exist between each device. In another example, if a full ship refresh time was 64 ms, an 8 ms stagger may be used to divide up equally. Similarly, if 16 devices exist per rank, at 32 ms full chip refresh, a 2 ms stagger may be used. For 64 ms (i.e., with 16 components), a 4 ms stagger may be used.

Further, an offset between refresh address counters may vary. More specifically, in one example, each refresh address counter (e.g., of a DIMM or a rank of a DIMM) may be offset from another counter (e.g., of a DIMM or a rank of a DIMM) by a specific amount. As another example, some refresh address counters (e.g., of a DIMM or a rank of a DIMM) may be offset from another refresh address counter (e.g., of the DIMM or the rank of the DIMM) by first amount, and other refresh address counters (e.g., of the DIMM or the rank of the DIMM) may be offset from another refresh address counter (e.g., of the DIMM or the rank of the DIMM) by a second, different amount.

In addition to uniquely configuring a number of memory devices of a memory module (i.e., with an initial address count value), as described more fully below, a number of memory modules of a memory system may also be uniquely configured (i.e., based on uniquely configured memory devices of each memory module).

As will be appreciated, various embodiments disclosed herein may provide additional row hammer protection and/or increase the difficulty for bad actors (e.g., hackers) to develop patterns (e.g., to hack or cause failures). In other words, various embodiments may increase the complexity of refresh patterns (i.e., of a number of memory devices on a DIMM) and, thus a total possible number of hammers before a refresh may be reduced (i.e., due to interleaving addresses in a rank). Further, because a number of fail bits may be reduced, in some situations, a failed memory device may be correctable via error-correcting code (ECC) memory.

Although various embodiments are described herein with reference to memory devices, the present disclosure is not so limited, and the embodiments may be generally applicable to microelectronic devices that may or may not include semiconductor devices and/or memory devices. Embodiments of the present disclosure will now be explained with reference to the accompanying drawings.

FIG. 1 includes a block diagram of an example memory device 100, according to various embodiments of the present disclosure. Memory device 100 may include, for example, a DRAM (dynamic random access memory), a SRAM (static random access memory), a SDRAM (synchronous dynamic random access memory), a DDR SDRAM (double data rate DRAM, such as a DDR4 SDRAM and the like), or a SGRAM (synchronous graphics random access memory). Memory device 100, which may be integrated on a semiconductor chip, may include and/or may be referred to herein as a "memory die."

Memory device 100 may include a memory cell array 102. In the embodiment of FIG. 1, memory cell array 102 is shown as including eight memory banks BANK0-7. More or fewer banks may be included in memory cell array 102 of other embodiments. Each memory bank includes a number of access lines (word lines WL), a number of data lines (bit lines BL) and /BL, and a number of memory cells MC arranged at intersections of the number of word lines WL and the number of bit lines BL and /BL. The selection of a word line WL (also referred to herein as a "row line") (i.e., to access a row of memory cells) may be performed by a row decoder 104 and the selection of the bit lines BL and /BL may be performed by a column decoder 106. In the embodiment of FIG. 1, row decoder 104 may include a respective row decoder for each memory bank BANK0-7, and column decoder 106 may include a respective column decoder for each memory bank BANK0-7.

Bit lines BL and /BL are coupled to a respective sense amplifier SAMP. Read data from bit line BL or/BL may be amplified by sense amplifier SAMP, and transferred to read/write amplifiers 107 over complementary local data lines (LIOT/B), transfer gate (TG), and complementary main data lines (MIOT/B). Conversely, write data outputted from read/write amplifiers 107 may be transferred to sense amplifier SAMP over complementary main data lines MIOT/B, transfer gate TG, and complementary local data lines LIOT/B, and written in memory cell MC coupled to bit line BL or /BL.

Memory device 100 may be generally configured to be receive various inputs (e.g., from an external controller) via various terminals, such as address terminals 110, command terminals 112, clock terminals 114, data terminals 116, and data mask terminals 118. Memory device 100 may include additional terminals such as power supply terminals 120 and 122.

During a contemplated operation, one or more command signals COM, received via command terminals 112, may be conveyed to a command decoder 150 via a command input circuit 152. Command decoder 150 may include a circuit configured to generate various internal commands via decoding one or more command signals COM. Examples of the internal commands include an active command ACT and a read/write signal R/W.

Further, one or more address signals ADD, received via address terminals 110, may be conveyed to an address decoder 130 via an address input circuit 132. Address decoder 130 may be configured to supply a row address XADD to row decoder 104 and a column address YADD to column decoder 106. Although command input circuit 152 and address input circuit 132 are illustrated as separate circuits, in some embodiments, address signals and command signals may be received via a common circuit.

Active command ACT may include a pulse signal that is activated in response to a command signal COM indicating row access (e.g., an active command). In response to active signal ACT, row decoder 104 of a specified bank address may be activated. As a result, the word line WL specified by row address XADD may be selected and activated.

Read/write signal R/W may include a pulse signal that is activated in response to a command signal COM indicating column access (e.g., a read command or a write command). In response to read/write signal R/W, column decoder 106 may be activated, and the bit line BL specified by column address YADD may be selected.

In response to active command ACT, a read signal, a row address XADD, and a column address YADD, data may be read from memory cell MC specified by row address XADD and column address YADD. The read data may be output via a sense amplifier SAMP, a transfer gate TG, read/write amplifier 107, an input/output circuit 162, and data terminal 116. Further, in response to active command ACT, a write signal, a row address XADD, and a column address YADD, write data may be supplied to memory cell array 102 via data terminal 116, input/output circuit 162, read/write amplifier 107, transfer gate TG, and sense amplifier SAMP. The write data may be written to memory cell MC specified by row address XADD and column address YADD.

Clock signals CK and /CK may be received via clock terminals 114. A clock input circuit 170 may generate internal clock signals ICLK based on clock signals CK and /CK. Internal clock signals ICLK may be conveyed to various components of memory device 100, such as command decoder 150 and an internal clock generator 172. Internal clock generator 172 may generate internal clock signals LCLK, which may be conveyed to input/output circuit 162 (e.g., for controlling the operation timing of input/output circuit 162). Further, data mask terminals 118 may receive one or more data mask signals DM. When data mask signal DM is activated, overwrite of corresponding data may be prohibited.

Memory device 100 may also include a controller 180 and a counter 182, which may include a refresh address counter. Controller 180 (also referred to herein as a "local memory controller") may control the accessing of memory cells MC through the various components (e.g., row decoder 104, column decoder 106, sense amplifier SAMP). In some examples, one or more of row decoder 104, column decoder 106, and sense amplifier SAMP may be co-located with (e.g., included in) controller 180. Controller 180 may be operable to receive one or more of commands or data from a host device (not shown in FIG. 1; see FIG. 2) or another controller associated with memory device 100, translate the commands or the data (or both) into information that can be used by memory device 100, perform one or more operations on memory device 100, and communicate data from memory device 100 to a host device based on performing the one or more operations.

For example, controller 180 may be operable to perform one or more access operations on one or more memory cells MC of memory device 100. Examples of access operations may include write operations, read operations, or refresh operations, among others. In some examples, access operations may be performed by or otherwise coordinated by controller 180 in response to various access commands, which may be generated internally or received from an external device (e.g., from a host device). Controller 180 may in some cases be operable to perform other access operations not disclosed herein or other operations related to the operating of memory device 100 that are not directly related to accessing memory cells MC of memory cell array 102.

For some types of memory cells MC, such as volatile memory cells, a logic value stored by a memory cell may degrade over time (e.g., due to leakage or other effects). Controller 180 may perform re-write or refresh operations (e.g., periodically or on another scheduled or commanded basis) to maintain memory cells as storing their respective logic values. Performing a refresh operation may involve activating one or more word lines WL, where controller 180 may rewrite a stored logic value to memory cells MC coupled with the one or more word lines WL.

Counter 182 may be coupled with controller 180. Alternatively, counter 182 may be included in controller 180 or directly coupled with row decoder 104, among other possible configurations. Counter 182 may indicate a value (also referred to herein as a "count" or an "index") corresponding to (e.g., comprising or otherwise indicating) a row address (alternatively, a word line address, word line index, or refresh index), where each row of memory cells of memory cell array 102 has a unique row address.

When a refresh operation is to be performed, a row having the row address corresponding to the value of counter 182 may be activated, and some or all of the memory cells coupled with the activated row may be refreshed. In some cases, memory device 100 may refresh multiple rows (e.g., two, four, eight, or sixteen rows) of memory cells MC as part of a single refresh operation, which may be coupled with a corresponding set of rows referred to as a row group. The value of counter 182 may indicate a starting row address for the row group, or each row group may have a corresponding refresh value, for example. Counter 182 may increment (or alternatively decrement) its value for each refresh operation, such that when the next refresh operation is to be performed, the value of counter 182 corresponds to row (or row group) coupled with cells that were not refreshed as part of the prior refresh operation. In some cases, a refresh operation may be performed in response to a command received by memory device 100 from an external device (e.g., a host device). Additionally or alternatively, a refresh operation may be performed based on a command generated internally at memory device 100 (e.g., by controller 180). It is noted that various refresh operations, as referenced herein, may include refreshing a main array and redundant rows of a memory cell array (e.g., memory cell array 102)

Figure 2:
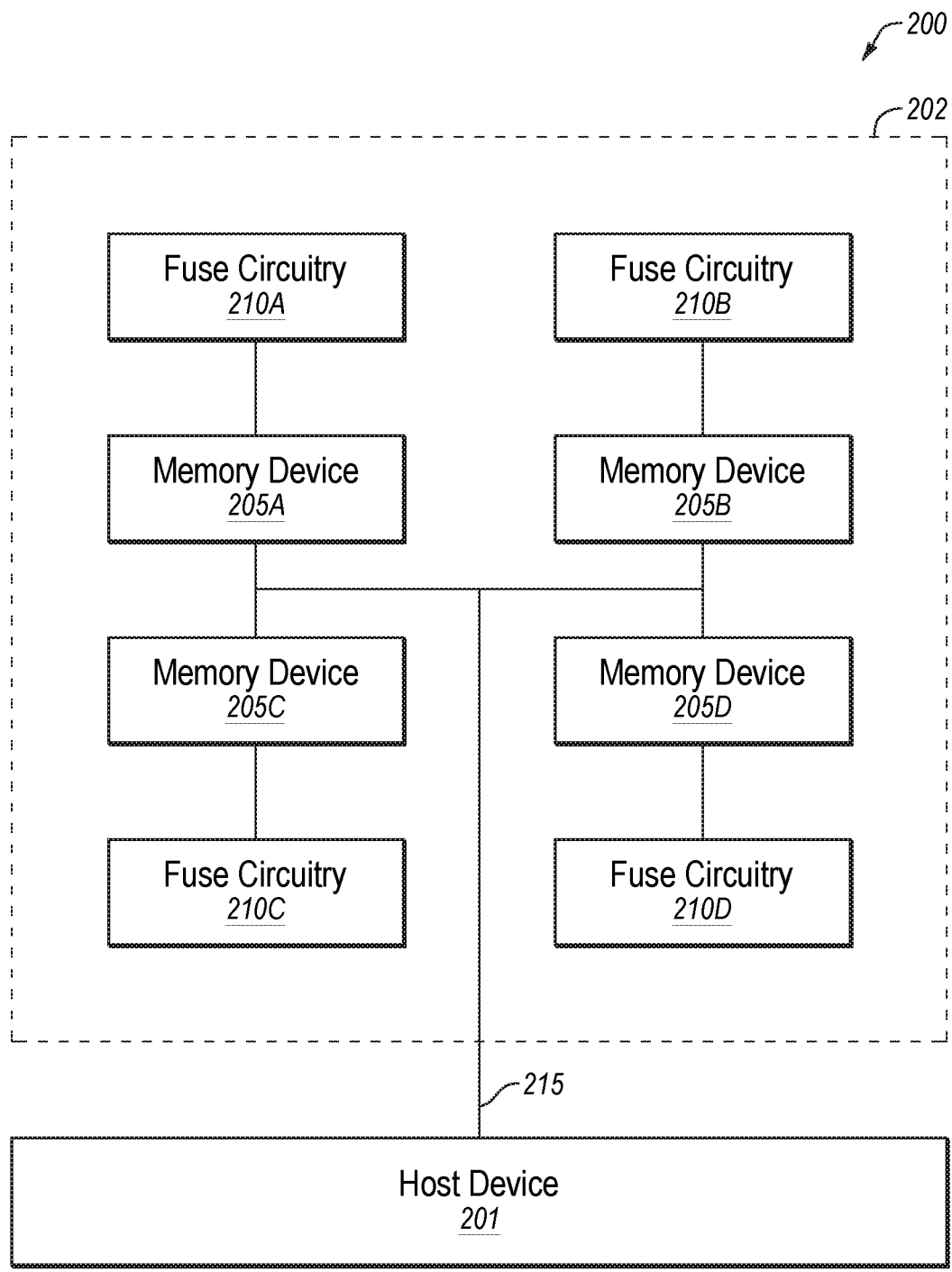
FIG. 2 depicts an example system including a number of memory devices, in accordance with various embodiments of the present disclosure.

FIG. 2 illustrates an example of a memory system 200, in according with various embodiments of the present disclosure. As described more fully herein, memory system 200 is configured to support staggered refresh address counters for a number of memory devices.

System 200 may include a host device 201. Host device 201 may be an example of a device that uses memory to execute processes, such as a central processing unit (CPU), a graphics processing unit (GPU), or another type of processor. System 200 may also include a device 202, which may be, for example, a memory module, and may include two or more memory devices 205 (e.g., memory devices 205A-205D). Though four memory devices 205 are shown, it is to be understood that any number of memory devices 205 are possible. Each of memory devices 205A, 205B, 205C, and 205D may include memory device 100, as described above with reference to FIG. 1. For example, each memory device 205 may include a refresh address counter (e.g., counter 182 of FIG. 1).

Each memory device 205 within device 202 may be coupled with host device 201 via shared CA bus 215. In some cases, memory devices 205 that share CA bus 215 may be collectively referred to a rank, and though one rank is shown, memory device 202 may include any number of ranks. CA bus 215 may carry signals between host device 201 and memory devices 205, and CA bus 215 may include any combination of one or more coupled signal paths (e.g., wire traces, bond wires, pads or pins, or the like). As CA bus 215 may be shared among memory devices 205, each signal transmitted by host device 201 may be received by each of memory devices 205. Some examples of signals transmitted by host device 201 along CA bus 215 may include commands such as read commands, write commands, and refresh commands. Host device 201 may also be coupled with one or more data (DQ) buses (not shown), which may carry data between host device 201 and memory devices 205, where the data may be associated with (e.g., read or written in response to) the commands over CA bus 215.

Each memory device 205 may be coupled with a respective fuse circuitry 210. For example, memory device 205A may be coupled with fuse circuitry 210A, memory device 205B may be coupled with fuse circuitry 210B, memory device 205C may be coupled with fuse circuitry 210C, and memory device 205D may be coupled with fuse circuitry 210D. Each fuse circuitry 210 may include any number of fuses (or alternatively, anti-fuses or some other kind of non-volatile storage element), and the states of the fuses within fuse circuitry 210 may control (e.g., initialize or otherwise set) one or more operating parameters or other settings for a corresponding memory device 205.

Memory device 205 may read (sense or otherwise detect) the state of the fuses in the corresponding fuse circuitry 210 upon a boot event (booting or rebooting). For example, memory device 205 may initialize or otherwise set its refresh address counter (e.g., counter 182 of FIG. 1) to an initial value based on (as indicated by) the state of one or more fuses in the corresponding fuse circuitry 210. The states of the fuses in different fuse circuitries 210 may be varied such that the refresh address counters for at least some of the memory devices 205 are set to different initial values (i.e., count values of refresh address counters for at least some of memory devices 205 are offset).

After the boot event, host device 201 may send commands to memory devices 205 (e.g., write, read, refresh commands) via CA bus 215. Host device 201 and memory devices 205 also may exchange data based on the commands via one or more other buses. When host device 201 transmits a refresh command via CA bus 215, each of memory devices 205 may receive the refresh command, and each of memory devices 205 may refresh a respective set of memory cells based on the refresh command. For each memory device 205, which memory cells are refreshed may depend on the value of the refresh address counter for the memory device 205 at the time the refresh command is received. Thus, if two memory devices 205 have refresh address counters that indicate different values at the time the refresh command is received, the two memory devices 205 may refresh memory cells in different rows in response to the same refresh command, based on the different values of the two respective refresh address counters. The refresh address counters of memory devices 205 may increment (or decrement) in like fashion (e.g., by a same amount, or otherwise according to same pattern) in response to each refresh command over CA bus 215. Thus, any offsets between refresh address counters for memory devices 205 introduced upon boot up (e.g., by the fuse circuitries 210) may persist (be maintained) as device 202 operates.

According to some embodiments, a number of bits (e.g., test mode fuse (TMFZ) bits) (i.e., of fuse circuitry) may be programmed to create unique combinations of address count values on a number of memory devices (e.g., of a module). For example, depending on the memory device (e.g., DDR4 device or DDR5 device), four or five bits may be use to provide a unique solution (i.e., a unique address count value) for each die of a memory module. In at least one example, a bit may be used to skew memory bank refresh addresses within a memory die. In this example, all banks within a die may use the same counter, but some banks (e.g., half of the banks) may get an inversion on a certain refresh address to result in a different row address refreshed.

In one example, each memory device of a number (e.g., 18 for DDR4) of memory devices of a device (e.g., a memory module) may have a different address count value. This may ensure that not more than one device of the number of devices experiences a worst case scenario (e.g., hammer attack) at the same time. For example, it may take approximately 32 ms to refresh a memory module (e.g., 4096 refresh commands). In this example, 4096 commands/18 devices=227 refresh command offset in refresh address counter per device. Thus, in one example scenario, 227 refresh command (227 commands*7.8 us=1.77 ms) offset may be used. However, because 227 is not binary, a 256 command offset may be used as an example.

Figure 3A:
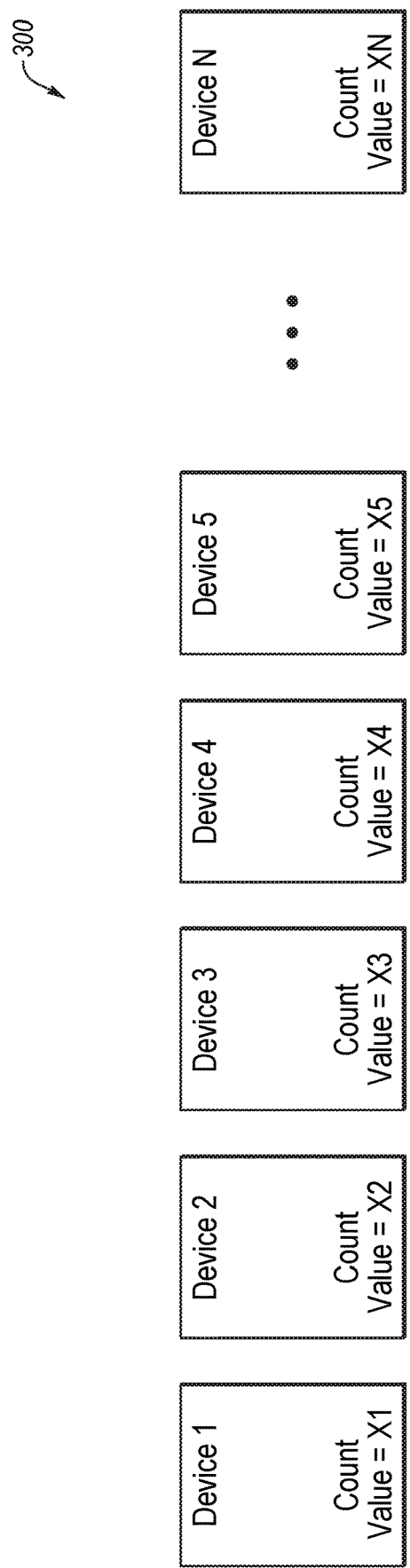
FIG. 3A depicts an example device including a number of memory devices, according to various embodiments of the present disclosure.

More specifically, with reference to FIG. 3A, in one example, a memory module 300 (e.g., DIMM) includes N (e.g., 18) memory devices, wherein each memory device has a different address count value (e.g., a counter value of each device may be offset by 256 refresh commands (2 ms)). In this example, a first device (e.g., Device 1) may experience the worst case scenario wherein a victim row is refreshed after approximately 32 ms. Continuing with this example, a second device (e.g., Device 2) includes an address count value offset from the address count value of the first device (e.g., offset by 256 commands (2 ms)), and a victim row of the second device is refreshed after approximately 30 ms (i.e., 32 ms-2 ms). Further, a third device (e.g., Device 3) includes an address count value offset from the address count value of the first device (e.g., offset by 512 commands (4 ms)), and a victim row of the third device is refreshed after approximately 28 ms (i.e., 32 ms-4 ms). Moreover, a fourth device (e.g., Device 4) includes an address count value offset from the address count value of the first device (e.g., offset by 768 commands (6 ms)), and a victim row of the fourth device is refreshed after approximately 26 ms (i.e., 32 ms-6 ms). In addition, a fifth device (e.g., Device 5) includes an address count value offset from the address count value of the first device (e.g., offset by 1024 commands (8 ms)), and a victim row of the fifth device is refreshed after approximately 24 ms (i.e., 32 ms-8 ms). Thus, in this non-limiting example, each address count value is offset from another address count value by 256 commands. In other examples, offsets between devices may vary.

Figure 3B:
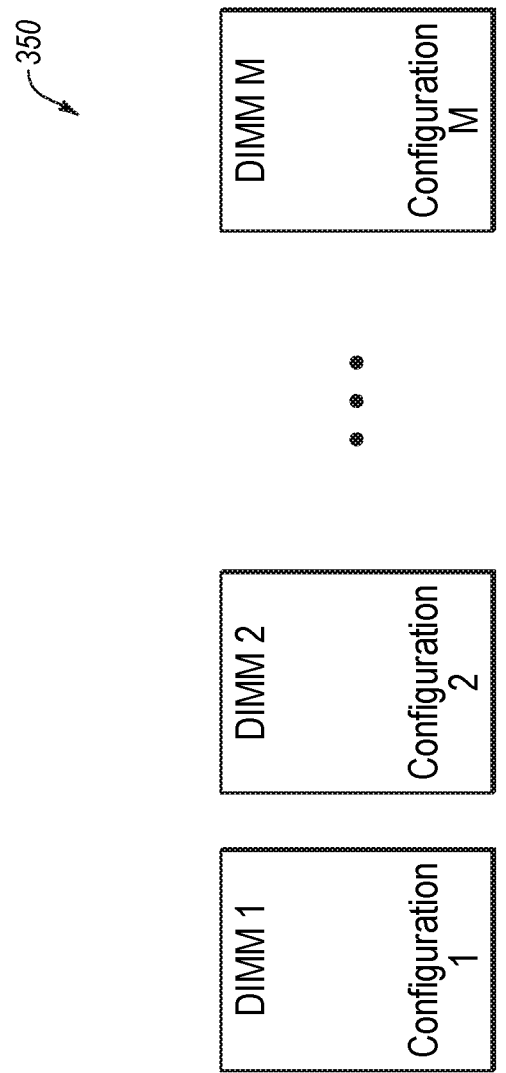
FIG. 3B depicts an example memory system including a number of memory modules, according to various embodiments of the present disclosure.

As noted above, according to various embodiments, a number of memory devices of a memory module may be uniquely configured (i.e., with an initial address count value). The ability to uniquely configure each memory device of a memory module also provides for the ability to uniquely configure a number of memory modules of a memory system. FIG. 3B depicts a memory system 350 including a number of memory modules (e.g., DIMM 1-DIMM M), according to various embodiments of the present disclosure. For example, each DIMM of memory system 350 may have a unique configuration. In one example, in DIMM 1 (i.e., that has configuration 1), a first memory device (e.g., in a first position) and a second memory device (e.g., in a second position) may have an address count value offset of X (e.g., 256 commands). Continuing with this example, in DIMM 2 (i.e., that has a configuration 2 that is different from configuration1), a first memory device (e.g., in a first position) and a second memory device (e.g., in a second position) may have an address count value offset of Y (e.g., 512 commands). Other memory devices of the memory modules of memory system 350 may have varying address count value offsets. Thus, for example, because at least some memory modules of memory system 350 are configured differently, a pattern that fails one memory module (e.g., memory module DIMM 1) may not necessarily fail another memory module (e.g., memory module DIMM 2).

Figure 4A:
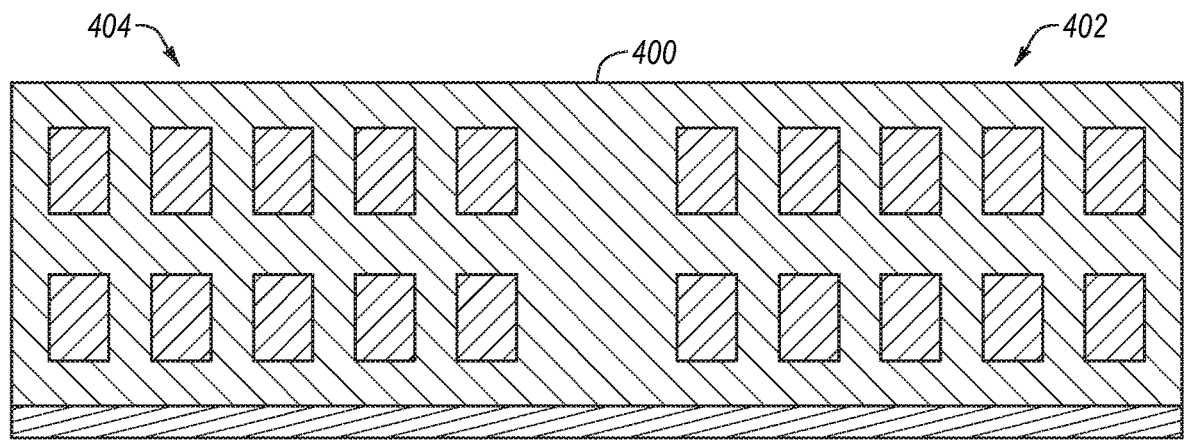
FIG. 4A depicts an example memory module including a number of memory devices, in accordance with various embodiments of the present disclosure.

FIG. 4A depicts a dual-rank DIMM 400 (e.g., 2 rank 2 channel SDP DDR5 RDIMM). More specifically, DIMM 400 includes a rank 402 and a rank 404, wherein each rank 402/404 includes ten (10) memory devices. As will be appreciated, each memory device in a rank may be refreshed at substantially the same time, and each memory device in a rank may receive an active command for the same address.

Figure 4B:
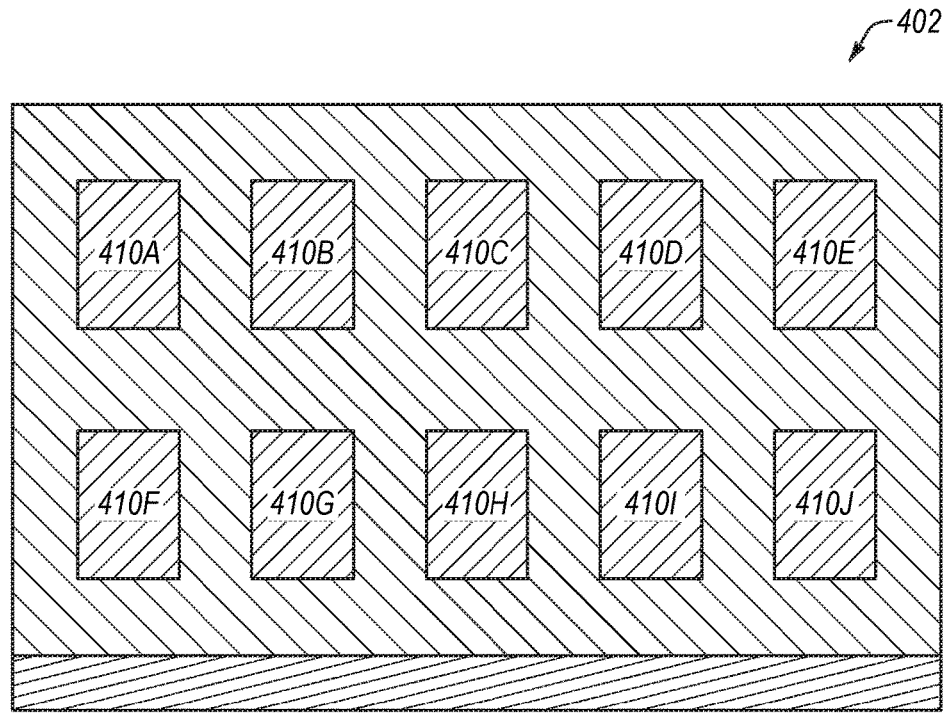
FIG. 4B depicts a portion of an example memory module including a number of memory devices, according to various embodiments of the present disclosure.

FIG. 4B depicts a portion of DIMM 400 including rank 402, which includes memory devices 410A-410J. According to various embodiments, blowing different fuse states for each memory device 410A-410J may result in an optimal hammer address to counter address differential. For example, a shift fuse for device 410A may not be blown, a shift fuse for 410B may be blown by 1/10 of an address range, a shift fuse for 410C may be blown by 2/10 of the address range, a shift fuse for 410D may be blown by 3/10 of the address range, a shift fuse for 410E may be blown by 4/10 of the address range, and so on such that a shift fuse for 410J may be blown by 9/10 of the address range. As will be appreciated, blowing different fuse states for each memory device 410A-410J may result in only one (1) memory device of rank 402 experiencing a worst case row hammer to counter address differential. Therefore, a number of bits that may fail on rank 402, and on DIMM 400, for an undetected row hammer attack may be reduced.

Figure 5:
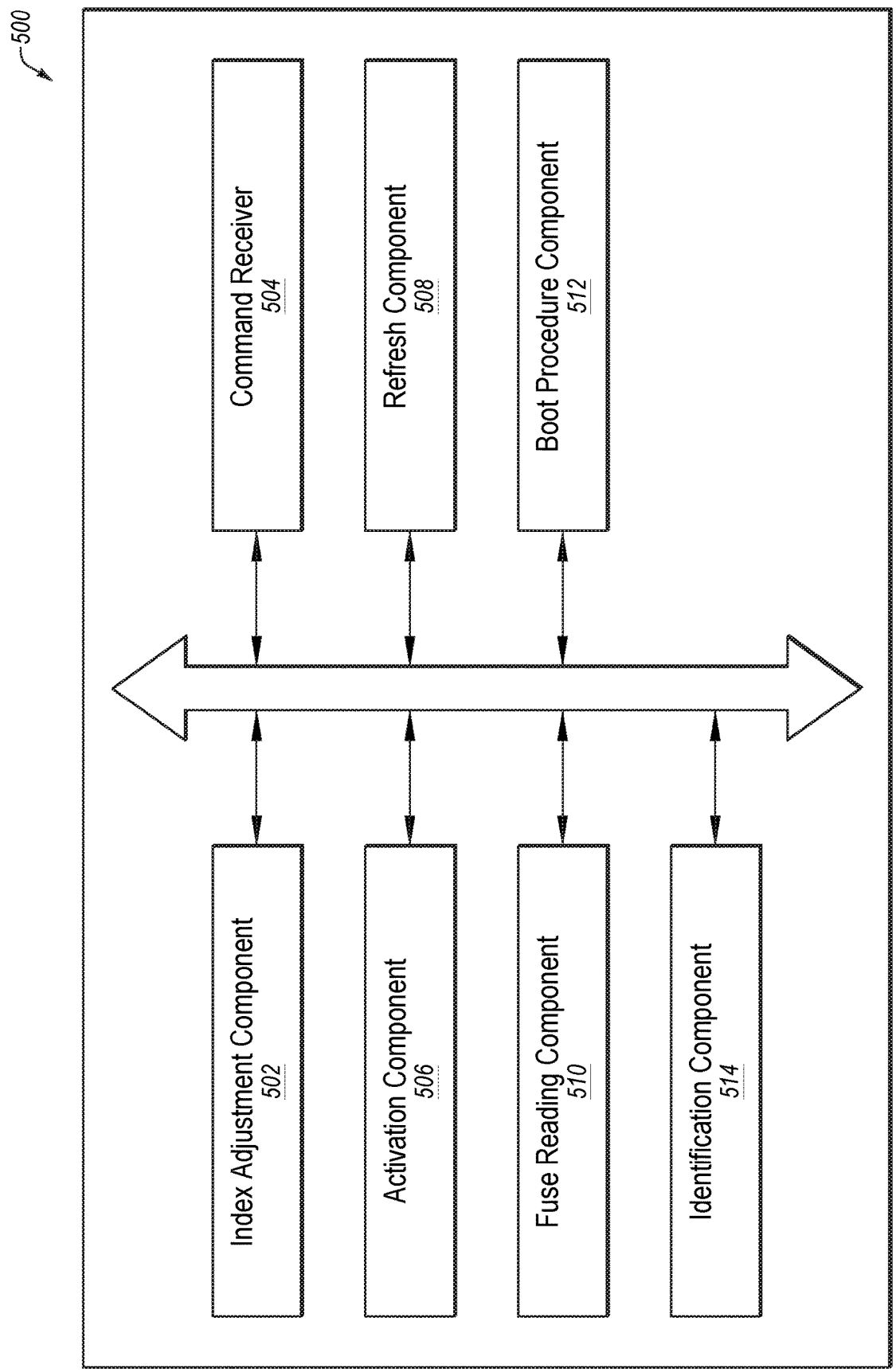
FIG. 5 is a block diagram illustrating various components of an example memory device, in accordance with various embodiments of the present disclosure.

FIG. 5 is a block diagram depicting various components of a memory device 500, in accordance with examples as disclosed herein. Memory device 500, which may include memory device 100 of FIG. 1, may include an index adjustment component 502, a command receiver 504, an activation component 506, a refresh component 508, a fuse reading component 510, a boot procedure component 512, and an identification component 514. Each of these modules may communicate, directly or indirectly, with one another (e.g., via one or more buses).

Fuse reading component 510 may be configured to read one or more fuse settings for memory device 500. Index adjustment component 502 may be configured to adjust a respective index (e.g., row index) for a refresh address counter (e.g., counter 182 of FIG. 1) (e.g., based on one or more fuse settings). In some examples, index adjustment component 502 may increase or decrease an index of the refresh address counter by an integer multiple of an adjustment factor. In some examples, index adjustment component 502 may invert one or more bits of the index to increase or decrease the index.

Command receiver 504 may be configured to receive a refresh command (e.g., via a channel that is common to a number of memory devices including memory device 500). Activation component 506 may be configured to activate at least one row of memory cells of memory device 500 based on the refresh command and the index. Identification component 514 may be configured to identify, in response to the refresh command, a row address for memory device 500. Refresh component 508 may be configured to refresh a number (e.g., a row) of memory cells based on activation component 506 activating the number of memory cells. Boot procedure component 512 may be configured to perform a boot or reboot procedure for memory device 500, where the adjusting (e.g., preformed via index adjustment component 502) may be based on the boot or reboot procedure. In some examples, index adjustment component 502 may increment the index in response to a refresh operation.

It is noted that although the description provided above with reference to FIG. 5 is for a single memory device, each memory device of a number of memory device (e.g., of a memory module) may include the components shown in FIG. 5, and each memory device of the number of memory devices may read one or more fuse components, adjust an associated index, receive the refresh command, activate a number of memory cells (i.e., based on the associated index), and refresh the activated memory cells. Further, according to various embodiments, at least one memory device (e.g., of a memory module) may adjust an index differently and/or may include an index that is different (e.g., offset) from an index of at least one other memory device (e.g., of the memory module).

Figure 6:
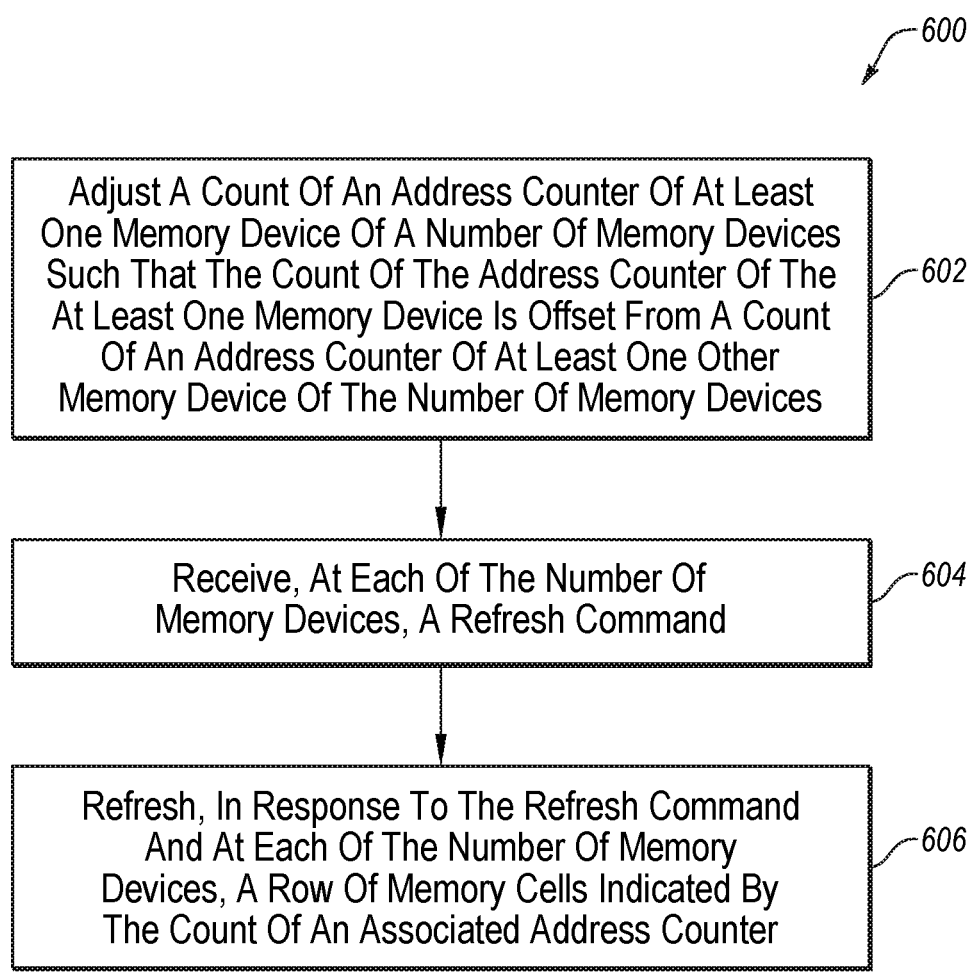
FIG. 6 is a flowchart of an example method of operating a number of memory devices, in accordance with various embodiments of the present disclosure.

FIG. 6 is a flowchart of an example method 600 of operating a number of memory devices, in accordance with various embodiments of the disclosure. Method 600 may be arranged in accordance with at least one embodiment described in the present disclosure. Method 600 may be performed, in some embodiments, by a device or system, such as memory device 100 of FIG. 1, system 200 of FIG. 2, memory module device 300 of FIG. 3A, memory system 350 of FIG. 3B, memory module 400 of FIG. 4A, rank 402 of FIG. 4B, memory device 500 of FIG. 5, memory system 800 of FIG. 8, and/or electronic system 900 of FIG. 9, or another device or system. Although illustrated as discrete blocks, various blocks may be divided into additional blocks, combined into fewer blocks, or eliminated, depending on the desired implementation.

Method 600 may begin at block 602, wherein a count of a refresh address counter of at least one memory device of a number of memory device may be adjusted such that the count of the refresh address counter of the at least one memory device is offset from a count of a refresh address counter of at least one other memory device of the number of memory devices, and method 600 may proceed to block 604. More specifically, for example, the count of refresh address counters of more than one memory device of the number of memory devices (e.g., of a memory module) may be adjusted such that the count of the refresh address counter of each memory device is offset from a count of an refresh address counter of every other memory device of the number of memory devices. For example, the count value of the refresh address counter (e.g., counter 182 of FIG. 1) may be adjusted via a controller (e.g., controller 180 of FIG. 1) and based on one or more fuse settings (e.g., of associated fuse circuitry 210 of FIG. 2).

At block 604, at each of the number of memory devices, a refresh command may be received, and method 600 may proceed to block 606. For example, each of the number of memory devices may receive the refresh command (e.g., at controller 180 of FIG. 1) via a CA bus (e.g., CA bus 215 of FIG. 2).

At block 606, at each of the number of memory devices, a row of memory cells indicated by the count of an associated refresh address counter may be refreshed. For example, the row of memory cells (of a memory cell array, such as memory cell array 102 of FIG. 1), which may be indicated by the count of the associated refresh address counter (e.g., counter 182 of FIG. 1) may be refreshed (e.g., via controller 180 of FIG. 1) in response to receipt of the refresh command.

Modifications, additions, or omissions may be made to method 600 without departing from the scope of the present disclosure. For example, the operations of method 600 may be implemented in differing order. Furthermore, the outlined operations and actions are only provided as examples, and some of the operations and actions may be optional, combined into fewer operations and actions, or expanded into additional operations and actions without detracting from the essence of the disclosed embodiment. For example, a method may include one or more acts wherein the one or more fuse settings associated with one or more of the number of memory devices may be programmed (e.g., during manufacturing or otherwise).

Figure 7:
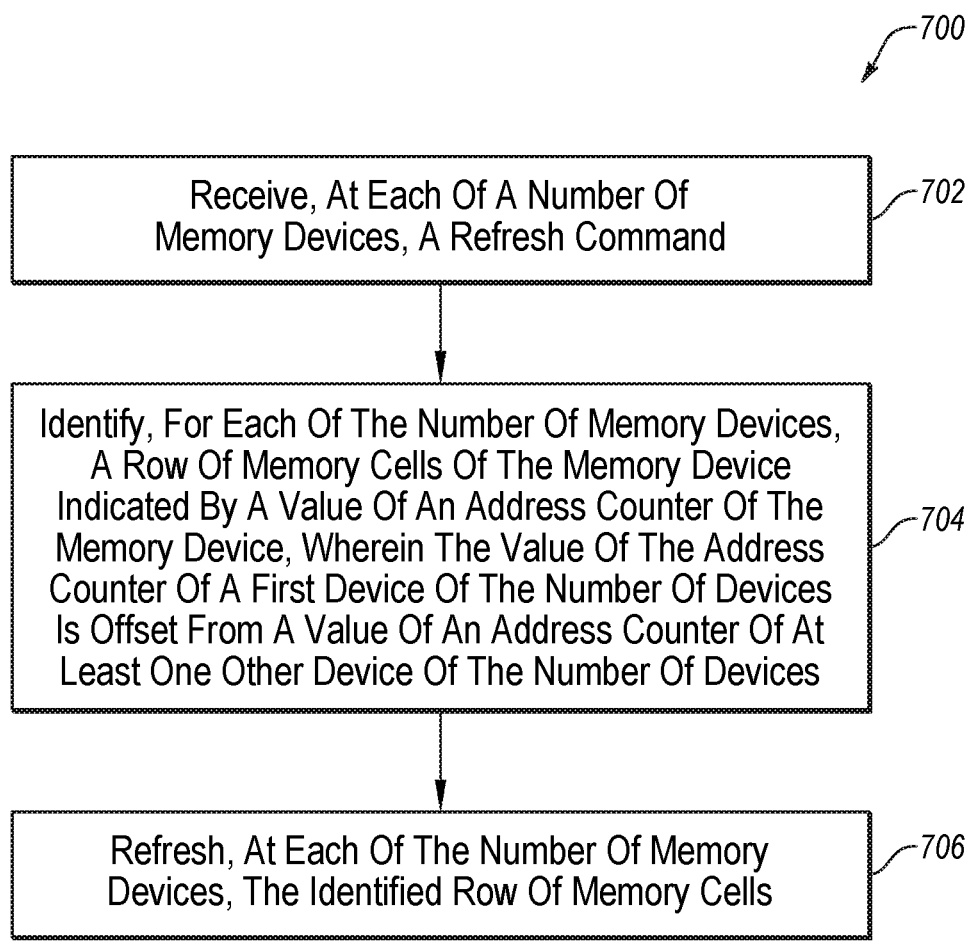
FIG. 7 is a flowchart of another example method of operating a number of memory devices, in accordance with various embodiments of the present disclosure.

FIG. 7 is a flowchart of an example method 700 of operating a number of memory devices, in accordance with various embodiments of the disclosure. Method 700 may be arranged in accordance with at least one embodiment described in the present disclosure. Method 700 may be performed, in some embodiments, by a device or system, such as memory device 100 of FIG. 1, system 200 of FIG. 2, memory module device 300 of FIG. 3A, memory system 350 of FIG. 3B, memory module 400 of FIG. 4A, rank 402 of FIG. 4B, memory device 500 of FIG. 5, memory system 800 of FIG. 8, and/or electronic system 900 of FIG. 9, or another device or system. Although illustrated as discrete blocks, various blocks may be divided into additional blocks, combined into fewer blocks, or eliminated, depending on the desired implementation.

Method 700 may begin at block 702, wherein, at each of a number of memory devices, a refresh command may be received, and method 700 may proceed to block 704. For example, each of the number of memory devices (e.g., of a memory module) may receive the refresh command (e.g., at controller 180 of FIG. 1) via a CA bus (e.g., CA bus 215 of FIG. 2).

At block 704, for each of the number of memory devices, a row of memory cells of the memory device indicated by a value of a refresh address counter of the memory device may be identified, and method 700 may proceed to block 706. The value of the refresh address counter of a first device of the number of devices is offset from a value of a refresh address counter of at least one other device of the number of devices. For example, the row of memory cells may be identified via controller 180 of FIG. 1, identification component 514 of FIG. 5, or a combination thereof.

At block 706, at each of the number of memory devices, the identified row of memory cells may be refreshed. For example, the identified row may be refreshed via controller 180 of FIG. 1.

Modifications, additions, or omissions may be made to method 700 without departing from the scope of the present disclosure. For example, the operations of method 700 may be implemented in differing order. Furthermore, the outlined operations and actions are only provided as examples, and some of the operations and actions may be optional, combined into fewer operations and actions, or expanded into additional operations and actions without detracting from the essence of the disclosed embodiment. For example, a method may include one or more acts wherein the value of the refresh address counter (i.e., at one or more of the number of memory devices) may be adjusted. Further, a method may include one or more acts wherein one or more fuses of one or more fuse circuits are set (e.g., such that the value of the refresh address counter of the first device is offset from the value of the refresh address counter of at least one other device).

A memory system is also disclosed. According to various embodiments, the memory system may include one or more memory devices including one or more memory cell arrays, such as memory cell array 102 (see FIG. 1). The one or more memory cell arrays may include a number of memory cells.

Figure 8:
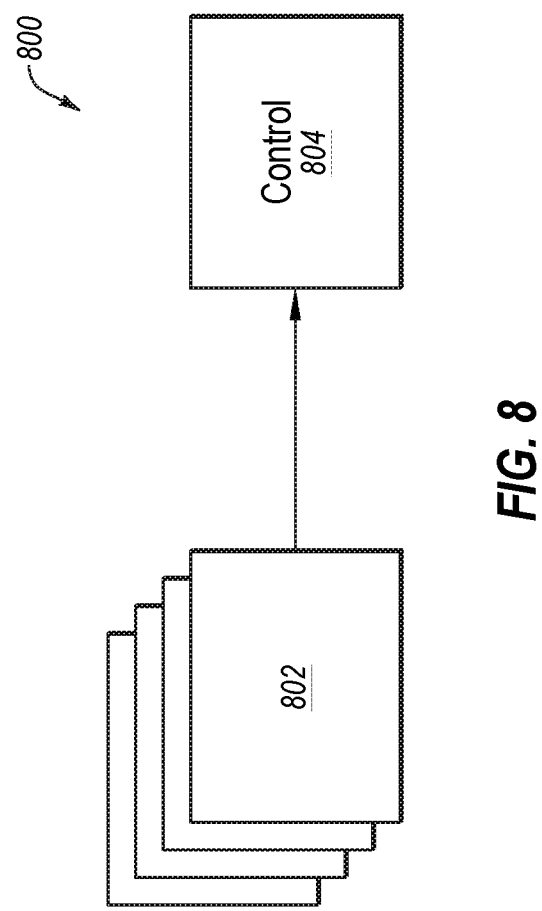
FIG. 8 is a simplified block diagram of an example memory system, in accordance with various embodiments of the present disclosure.

FIG. 8 is a simplified block diagram of a memory system 800 implemented according to one or more embodiments described herein. Memory system 800, which may include, for example, one or more semiconductor devices, includes a number of memory devices 802 and control 804. Each memory device 802, which may include a number of memory banks, may include a number of memory cells. For example, memory devices 802 may be part of a memory module.

Control 804 may be operatively coupled with each memory device 802 so as to enable data to be read from or written to any or all memory cells within each memory device 802. Control 804 and/or memory devices 802 may include one or more of the various components, circuits (e.g., counters), and/or devices described herein.

A system is also disclosed. According to various embodiments, the system may include a memory device including a number of memory banks, each memory bank having an array of memory cells. Each memory cell may include an access transistor and a storage element operably coupled with the access transistor.

Figure 9:
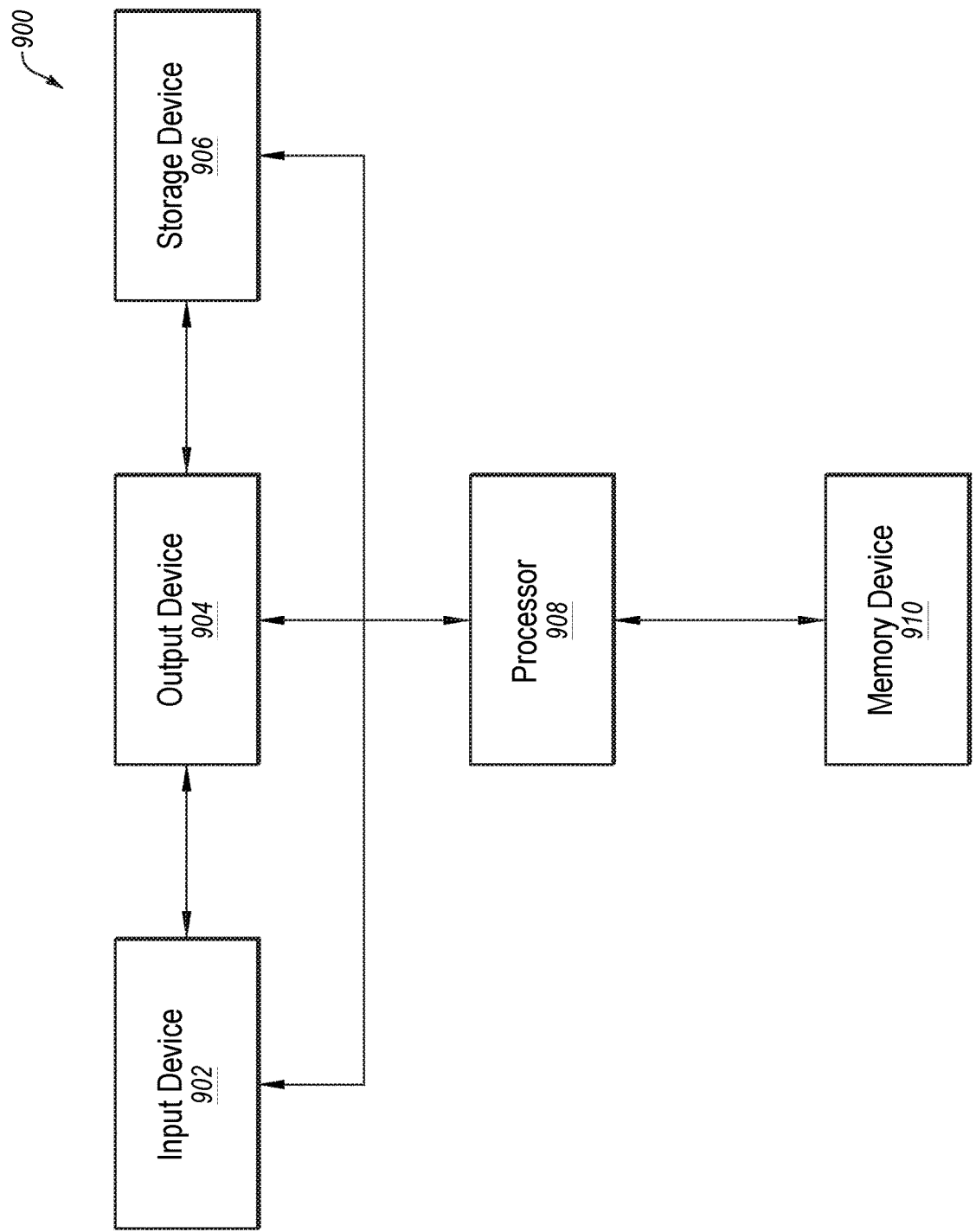
FIG. 9 is a simplified block diagram of an example electronic system, in accordance with various embodiments of the present disclosure.

FIG. 9 is a simplified block diagram of an electronic system 900 implemented according to one or more embodiments described herein. Electronic system 900 includes at least one input device 902, which may include, for example, a keyboard, a mouse, or a touch screen. Electronic system 900 further includes at least one output device 904, such as a monitor, a touch screen, or a speaker. Input device 902 and output device 904 are not necessarily separable from one another. Electronic system 900 further includes a storage device 906. Input device 902, output device 904, and storage device 906 may be coupled to a processor 908. Electronic system 900 further includes a memory device 910 coupled to processor 908. Memory device 910, which may include at least a portion of memory system 800 of FIG. 8, may include an array of memory cells. Electronic system 900 may include, for example, a computing, processing, industrial, or consumer product. For example, without limitation, electronic system 900 may include a personal computer or computer hardware component, a server or other networking hardware component, a database engine, an intrusion prevention system, a handheld device, a tablet computer, an electronic notebook, a camera, a phone, a music player, a wireless device, a display, a chip set, a game, a vehicle, or other known systems.

Uniquely programing a number memory devices on a DIMM and/or uniquely programming a number of DIMMs of a memory system may reduce the likelihood of multiple devices on a single DIMM and/or multiple DIMMs of a system failing (e.g., due to row hammer attacks). Thus, compared to conventional systems, devices, and methods, various embodiments of the present disclosure may reduce a number of fails (e.g., due to row hammer attacks).

Various embodiments of the present disclosure may include a method. The method may include adjusting a count of a refresh address counter of at least one memory device of a number of memory devices within a rank such that the count of the refresh address counter of the at least one memory device is offset from a count of a refresh address counter of at least one other memory device of the number of memory devices within the rank. The method may also include receiving, at each of the number of memory devices, a refresh command. Further, the method may include refreshing, at each of the number of memory devices, a row of memory cells indicated by the count of an associated refresh address counter.

According to other embodiments, a method may include receiving, at each of a number of memory devices sharing a refresh command bus, a refresh command. The method may also include identifying, for each of the number of memory devices, wherein a row of memory cells of the memory device is indicated by a value of a refresh address counter of the memory device. Further, the value of the refresh address counter of a first memory device of the number of memory devices is offset from a value of a refresh address counter of at least one other memory device of the number of memory devices. Moreover, the method may include refreshing, at each of the number of memory devices, the identified row of memory cells.

Some embodiments of the present disclosure include a memory module. The memory module may include a number of memory devices of a rank. Each memory device of the number of memory devices of the rank includes an array of memory cells and a refresh address counter having an index. Each memory device of the rank includes an index that is unique to the rank. Further each memory device of the number of memory devices of the rank includes a controller coupled to the refresh address counter and configured to refresh, based on the index of the refresh address counter, a row of the array of memory cells in response to receipt of a refresh command.

Additional embodiments of the present disclosure include an electronic system. The electronic system may include at least one input device, at least one output device, and at least one processor device operably coupled to the input device and the output device. The electronic system may also include a rank including a number of memory devices operably coupled to the at least one processor device. Each memory device of the number of memory devices of the rank comprises a counter having a count value offset from at least one other memory device of the number of memory devices. Further, each memory device of the number of memory devices is configured to refresh, in response to a refresh command, a row of memory cells based on an associated count value of a respective counter.

In accordance with common practice, the various features illustrated in the drawings may not be drawn to scale. The illustrations presented in the present disclosure are not meant to be actual views of any particular apparatus (e.g., device, system, etc.) or method, but are merely idealized representations that are employed to describe various embodiments of the disclosure. Accordingly, the dimensions of the various features may be arbitrarily expanded or reduced for clarity. In addition, some of the drawings may be simplified for clarity. Thus, the drawings may not depict all of the components of a given apparatus (e.g., device) or all operations of a particular method.

As used herein, the term "device" or "memory device" may include a device with memory, but is not limited to a device with only memory. For example, a device or a memory device may include memory, a processor, and/or other components or functions. For example, a device or memory device may include a system on a chip (SOC).

Terms used herein and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. As used herein, "and/or" includes any and all combinations of one or more of the associated listed items.

In addition, even if a specific number of an introduced claim recitation is explicitly recited, it is understood that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc. For example, the use of the term "and/or" is intended to be construed in this manner.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

Additionally, the use of the terms "first," "second," "third," etc., are not necessarily used herein to connote a specific order or number of elements. Generally, the terms "first," "second," "third," etc., are used to distinguish between different elements as generic identifiers. Absence a showing that the terms "first," "second," "third," etc., connote a specific order, these terms should not be understood to connote a specific order. Furthermore, absence a showing that the terms first," "second," "third," etc., connote a specific number of elements, these terms should not be understood to connote a specific number of elements.

The embodiments of the disclosure described above and illustrated in the accompanying drawings do not limit the scope of the disclosure, which is encompassed by the scope of the appended claims and their legal equivalents. Any equivalent embodiments are within the scope of this disclosure. Indeed, various modifications of the disclosure, in addition to those shown and described herein, such as alternative useful combinations of the elements described, will become apparent to those skilled in the art from the description. Such modifications and embodiments also fall within the scope of the appended claims and equivalents.

What is claimed is:

1. A method, comprising:
   adjusting a count of a refresh address counter of at least one memory device of a number of memory devices within a rank such that the count of the refresh address counter of the at least one memory device is offset from a count of a refresh address counter of at least one other memory device of the number of memory devices within the rank;
   receiving, at each of the number of memory devices, a refresh command; and
   refreshing, at each of the number of memory devices, at least one row of memory cells indicated by the count of an associated refresh address counter.

2. The method of claim 1, wherein adjusting the count comprises adjusting the count of a refresh address counter of more than one memory device of the number of memory devices such that the count of a refresh address counter of each memory device is offset from a count of a refresh address counter of every other memory device of the number of memory devices.

3. The method of claim 1, further comprising incrementing a count of each memory device of the number of memory devices in response to refreshing the row of memory cells.

4. The method of claim 1, wherein adjusting the count of the refresh address counter of at least one memory device comprises adjusting the count of the refresh address counter of more than one memory device of the number of memory device such a device-to-device counter offset amongst the number of memory devices is equal.

5. The method of claim 1, wherein adjusting the count comprises adjusting an initial count address of the at least one memory device responsive to a boot or a reboot operation.

6. The method of claim 1, further comprising programming, at each of the number of memory devices, one or more fuse settings.

7. The method of claim 6, wherein adjusting comprises adjusting, at each of the number of memory devices, an initial count address of an associated refresh address counter based on the one or more fuse settings.

8. A method, comprising
   receiving, at each of a number of memory devices that share a refresh command bus, a refresh command;
   identifying, for each of the number of memory devices, a row of memory cells of the memory device indicated by a value of a refresh address counter of the memory device, wherein the value of the refresh address counter of a first memory device of the number of memory devices is offset from a value of a refresh address counter of at least one other memory device of the number of memory devices; and
   refreshing, at each of the number of memory devices, the identified row of memory cells.

9. The method of claim 8, further comprising adjusting the value of the refresh address counter of the first memory device of the number of memory devices such that the value of the refresh address counter is offset from the value of a refresh address counter of at least one other memory device of the number of memory devices.

10. The method of claim 8, further comprising adjusting a value of a refresh address counter of one or more additional memory devices of the number of memory devices such that the value of a refresh address counter of each memory device is offset from a count of a refresh address counter of every other memory device of the number of memory devices.

11. The method of claim 8, further comprising setting, at least the first memory device, one or more fuses such that the value of the refresh address counter of the first memory device is offset from the value of the refresh address counter of at least one other memory device.

12. A memory module, comprising:
a number of memory devices of a rank, wherein each memory device of the number of memory devices of the rank includes:
an array of memory cells;
a refresh address counter having an index, wherein each memory device of the rank includes an index that is unique to the rank; and
a controller coupled to the refresh address counter and configured to refresh, based on the index of the refresh address counter, a row of the array of memory cells in response to receipt of a refresh command.

13. The memory module of claim 12, wherein the controller is further configured to adjust an index of one or more memory devices of the number of memory devices based on one or more fuse settings.

14. The memory module of claim 12, wherein each device of the number of devices is offset from at least one other device by the same offset.

15. The memory module of claim 12, wherein the controller is further configured to:
receive the refresh command;
identify the row of the array of memory cells based on the index of the memory device; and
activate the row of the array of memory cells to refresh the row of the array of memory cells.

16. A system comprising:
at least one input device;
at least one output device;
at least one processor device operably coupled to the input device and the output device; and
a rank including a number of memory devices operably coupled to the at least one processor device, wherein each memory device of the number of memory devices of the rank comprises a counter having a count value offset from at least one other memory device of the number of memory devices;
wherein each memory device of the number of memory devices is configured to refresh, in response to a refresh command, a row of memory cells based on an associated count value of a respective counter.

17. The system of claim 16, further comprising fuse circuitry, wherein the count value of each memory device of the number of memory devices is programmable via one or more fuses of the fuse circuitry.

18. The system of claim 17, wherein each memory device of the number of memory devices is coupled to dedicated fuse circuitry.

19. The system of claim 16, wherein each memory device of the number of memory devices comprises the counter having the count value offset from every other memory device of the number of memory devices.

20. The system of claim 16, wherein each memory device of the number of memory devices is configured to adjust its associated count value in response to a boot or a reboot operation and based on one or more associated fuse settings.

* * * * *

UNITED STATES PATENT AND TRADEMARK OFFICE
CERTIFICATE OF CORRECTION

PATENT NO. : 11,120,860 B1  
APPLICATION NO. : 16/987168  
DATED : September 14, 2021  
INVENTOR(S) : Wieduwilt et al.

Page 1 of 1

It is certified that error appears in the above-identified patent and that said Letters Patent is hereby corrected as shown below:

In the Specification  
Column 3, Line 30, change "(e.g. a" to --(e.g., a--  
Column 5, Line 34, change "or/BL" to --or /BL--

Signed and Sealed this  
Nineteenth Day of October, 2021

Drew Hirshfeld  
*Performing the Functions and Duties of the*  
*Under Secretary of Commerce for Intellectual Property and*  
*Director of the United States Patent and Trademark Office*